US012578398B2

(12) United States Patent　　(10) Patent No.: US 12,578,398 B2

Kim　　(45) Date of Patent: Mar. 17, 2026

(54) EXTERNAL SHORT DIAGNOSIS METHOD OF PREVENTING MELT BONDING AND BATTERY SYSTEM WHERE THE METHOD IS APPLIED

(71) Applicant: LG Energy Solution, Ltd., Seoul (KR)

(72) Inventor: Jinhwan Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 145 days.

(21) Appl. No.: 18/567,437

(22) PCT Filed: Dec. 13, 2022

(86) PCT No.: PCT/KR2022/020237

§ 371 (c)(1),
(2) Date: Dec. 6, 2023

(87) PCT Pub. No.: WO2023/132502

PCT Pub. Date: Jul. 13, 2023

(65) Prior Publication Data

US 2024/0288509 A1　　Aug. 29, 2024

(30) Foreign Application Priority Data

Jan. 6, 2022　(KR) .................. KR10-2022-0002134

(51) Int. Cl.
G01R 31/52　　(2020.01)
G01R 19/00　　(2006.01)
(Continued)

(52) U.S. Cl.
CPC ......... G01R 31/52 (2020.01); G01R 19/0038 (2013.01); G01R 19/10 (2013.01);
(Continued)

(58) Field of Classification Search
CPC .... G01R 31/52; G01R 31/385; G01R 31/392; G01R 31/396; G01R 19/0038; G01R 19/10
(Continued)

(56) References Cited

U.S. PATENT DOCUMENTS 10,106,036 B2　　10/2018　Chatroux et al.
11,189,891 B2 *　11/2021　Fukushima ....... H01M 10/4257
(Continued)

FOREIGN PATENT DOCUMENTS

CN　　113733916 A　　12/2021
JP　　2006340450 A　　12/2006
(Continued)

OTHER PUBLICATIONS

Extended European Search Report including Written Opinion for Application No. 22919039.2 dated Oct. 28, 2024, pp. 1-5.
(Continued)

*Primary Examiner* — Huy Q Phan
*Assistant Examiner* — Trung Q Nguyen
(74) *Attorney, Agent, or Firm* — Lerner David LLP

(57)　　ABSTRACT

A battery system includes a battery pack including a plurality of battery cells, a first main relay including a first end connected to a positive electrode of the battery pack, a second main relay including a first end connected to a negative electrode of the battery pack, a first link line connected to a second end of the first main relay, a second link line connected to a second end of the second main relay, and a battery management system is configured to close the first main relay, measure a positive electrode voltage of the battery pack and a negative link voltage of the second link line, and determine occurrence of an external short circuit in response to a voltage difference between the positive elec-
(Continued)

trode voltage of the battery pack and the negative link voltage being less than a predetermined reference voltage.

11 Claims, 3 Drawing Sheets

(51) Int. Cl.
| | | |
|---|---|---|
| *G01R 19/10* | (2006.01) | |
| *G01R 31/385* | (2019.01) | |
| *G01R 31/392* | (2019.01) | |
| *G01R 31/396* | (2019.01) | |

(52) U.S. Cl.
CPC ......... *G01R 31/385* (2019.01); *G01R 31/392* (2019.01); *G01R 31/396* (2019.01)

(58) Field of Classification Search
USPC .............................. 324/500, 600, 76.11, 509
See application file for complete search history.

(56) References Cited

U.S. PATENT DOCUMENTS

| | | | | |
|---|---|---|---|---|
| 11,404,885 | B1 * | 8/2022 | Tenorio ............. | H01M 10/4257 |
| 12,142,953 | B2 * | 11/2024 | Chen ................... | H02J 7/00304 |
| 2006/0267557 | A1 | 11/2006 | Nakano et al. | |
| 2007/0139005 | A1 | 6/2007 | Osawa | |
| 2020/0144832 | A1 | 5/2020 | Kim | |
| 2021/0041502 | A1 | 2/2021 | Song | |
| 2021/0268935 | A1 * | 9/2021 | Aschenbrenner ....... | B60L 50/61 |
| 2021/0270900 | A1 | 9/2021 | Imanaka | |
| 2022/0223988 | A1 * | 7/2022 | Cho .................... | H02J 7/00032 |
| 2022/0407122 | A1 * | 12/2022 | Marshall ............. | H01M 10/482 |
| 2023/0187757 | A1 * | 6/2023 | Pouyadou ............. | H02J 7/0047 |
| | | | | 429/7 |

FOREIGN PATENT DOCUMENTS

| | | | |
|---|---|---|---|
| JP | 2007165253 | A | 6/2007 |
| JP | 2013145175 | A | 7/2013 |
| JP | 5381890 | B2 | 1/2014 |
| JP | 6337833 | B2 | 6/2018 |
| JP | 2021069229 | A | 4/2021 |
| KR | 101504274 | B1 | 3/2015 |
| KR | 20200075095 | A | 6/2020 |
| KR | 102256101 | B1 | 5/2021 |
| KR | 20210060136 | A | 5/2021 |
| KR | 20220000740 | A | 1/2022 |
| KR | 102412313 | B1 | 6/2022 |
| WO | 2019189405 | A1 | 10/2019 |

OTHER PUBLICATIONS

International Search Report for PCT/KR2022/020237 mailed Apr. 3, 2023. 3 pages.

* cited by examiner

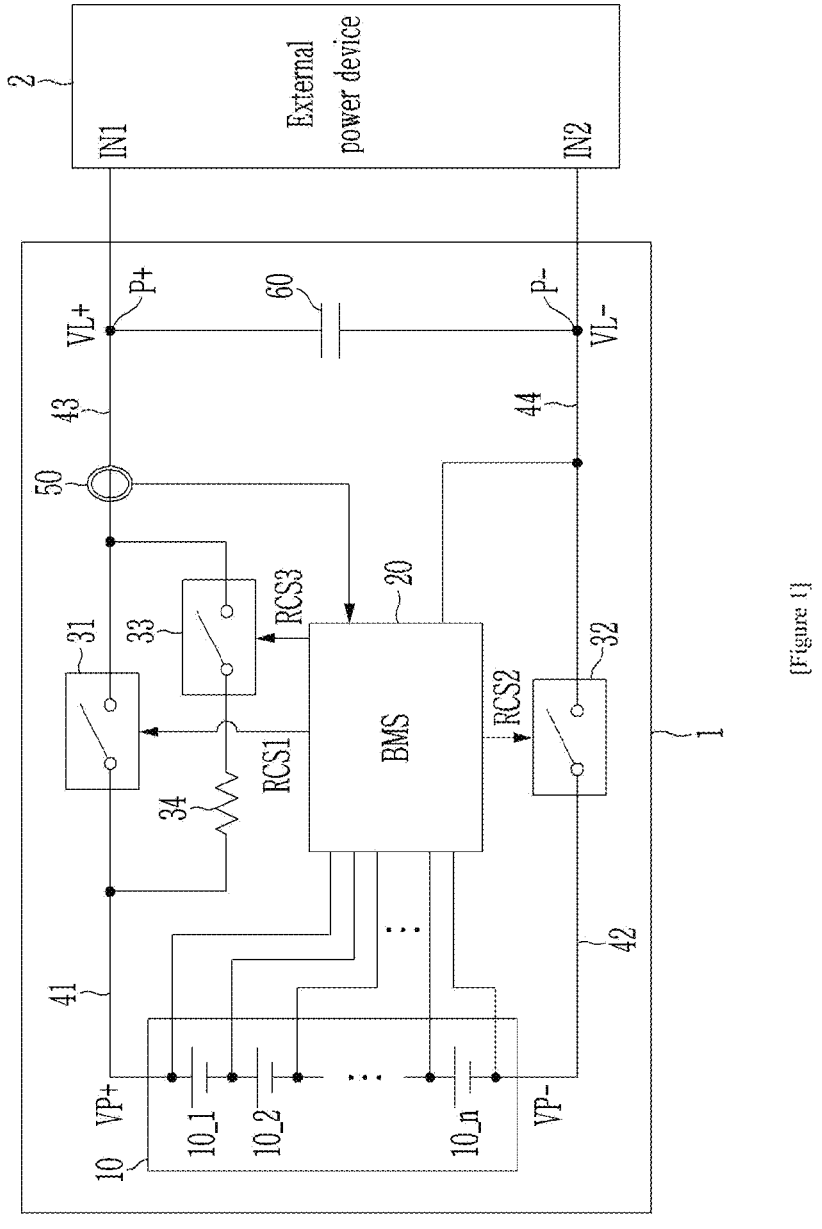
[Figure 1]

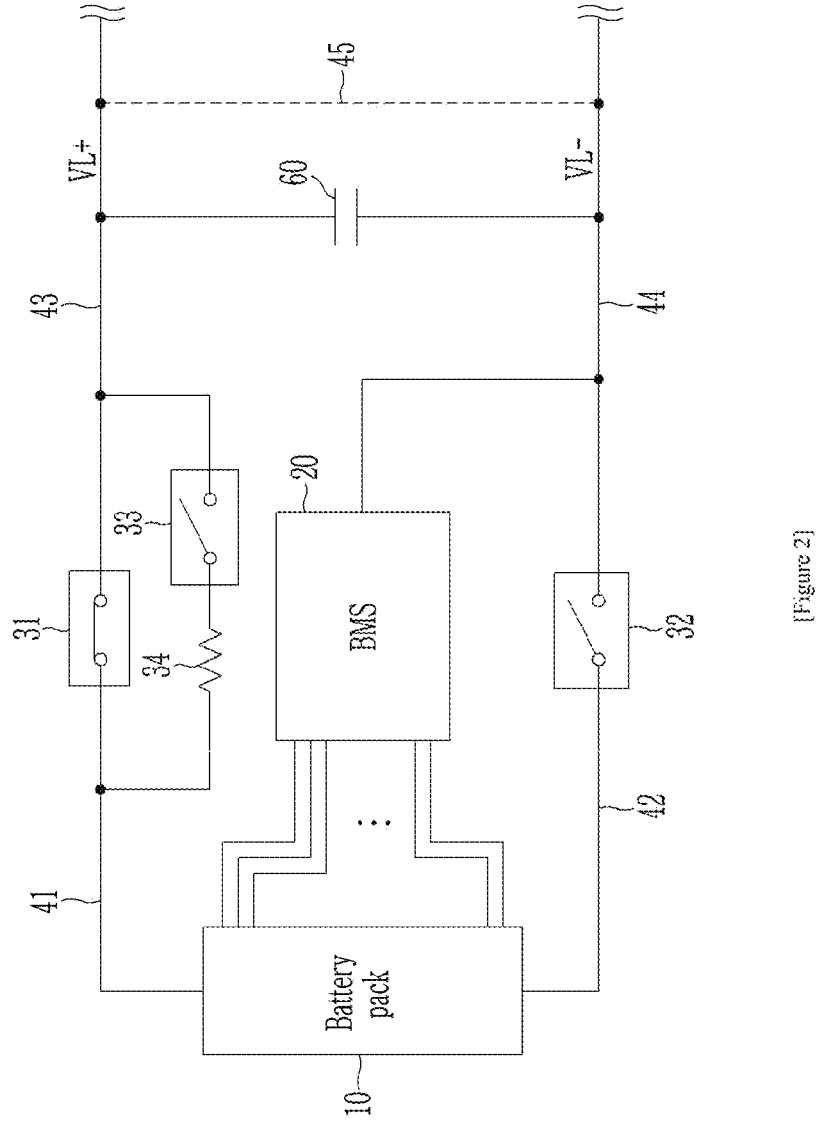
[Figure 2]

【Figure 3】
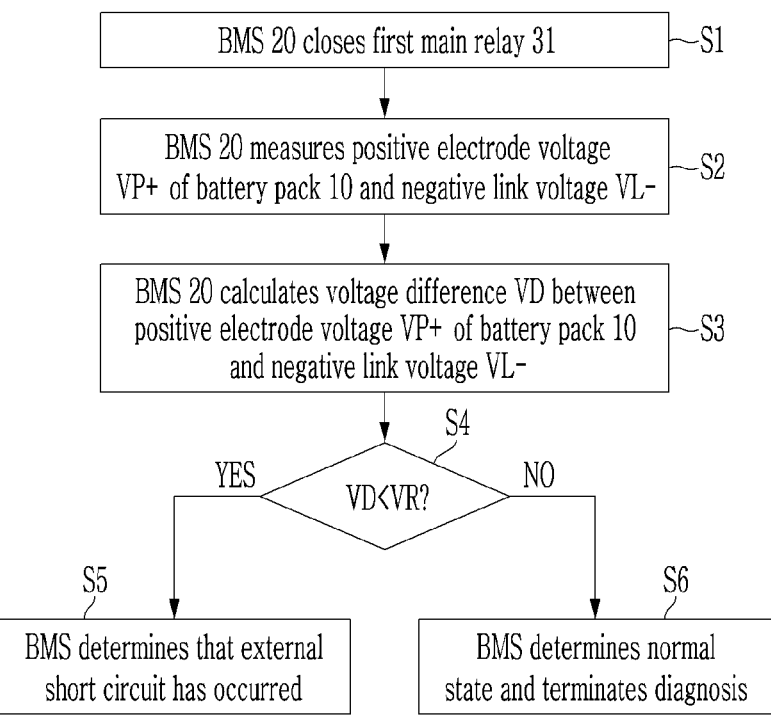

EXTERNAL SHORT DIAGNOSIS METHOD OF PREVENTING MELT BONDING AND BATTERY SYSTEM WHERE THE METHOD IS APPLIED

CROSS-REFERENCE TO RELATED APPLICATION

The present application is a national phase entry under 35 U.S.C. § 371 of International Application No. PCT/KR2022/020237 filed Dec. 13, 2022, which claims priority from Korean Patent Application no. 10-2022-0002134 filed Jan. 6, 2022, all of which are incorporated herein by reference.

TECHNICAL FIELD

The present disclosure relates to a method for diagnosing an external short circuit and a battery system using the same.

BACKGROUND ART

Currently, a method for diagnosing an external short circuit of a high voltage battery pack uses a current flowing in a precharging path during pre-charging of the high voltage battery pack. For example, a battery management system of a high voltage battery measures a current flowing in a link line between a high voltage battery pack and an external device during precharging of the high voltage battery. The battery management system protects high-voltage batteries from external short circuits by cutting off connection between battery packs and external devices when a measured current exceeds a threshold.

However, in the case of using the above method, a large current may flow in the link line during the precharging period before the connection is cut off, and a relay, a resistor, and the high voltage battery pack connected between the high voltage battery pack and the external device may be damaged.

SUMMARY

Technical Problem

The present invention has been made in an effort to provide a method for diagnosing an external short circuit having advantages of diagnosing an external short circuit without damaging devices constituting a battery system, and a battery system using the same.

Technical Solution

An exemplary embodiment of the present invention provides a battery system including: a battery pack including a plurality of battery cells; a first main relay including a first end connected to a positive electrode of the battery pack; a second main relay including a first end connected to a negative electrode of the battery pack; a first link line connected to a second end of the first main relay; a second link line connected to a second end of the second main relay; and a battery management system configured to close the first main relay, measure a positive electrode voltage of the battery pack and a negative link voltage of the second link line, and determine occurrence of an external short circuit in response to a voltage difference between the positive electrode voltage of the battery pack and the negative link voltage being less than a predetermined reference voltage.

The battery management system may be configured to determine the occurrence of the external short circuit in response to a voltage obtained by subtracting the negative link voltage from the positive electrode voltage of the battery pack being less than the predetermined reference voltage.

The battery management system may be configured to generate the predetermined reference voltage by multiplying the positive electrode voltage of the battery pack by a predetermined ratio.

The battery management system may be configured to close the first main relay and open the second main relay during a predetermined diagnosis period for determining the occurrence of the external short circuit.

The battery system may further include: a precharge relay connected in parallel to the first main relay, wherein the battery management system may be configured to close the first main relay and open the precharge relay during a predetermined diagnosis period for determining the occurrence of the external short circuit.

A battery system may include a first main relay including a first end connected to a positive electrode of a battery pack including a plurality of battery cells, a second main relay including a first end connected to a negative electrode of the battery pack, and a battery management system.

Another embodiment of the present invention provides a method for diagnosing an external short circuit of a battery system performed by the battery management system, including: closing the first main relay during a diagnosis period; measuring a positive electrode voltage of the battery pack and a negative link voltage of a second link line; comparing a voltage difference between the positive link voltage of the battery pack and the negative link voltage with a predetermined reference voltage; and determining occurrence of an external short circuit in response to the voltage difference being less than the predetermined reference voltage.

The comparing of the voltage difference with the predetermined reference voltage may include determining whether a voltage obtained by subtracting the negative link voltage from the positive electrode voltage of the battery pack is smaller than the predetermined reference voltage.

The method may further include: generating the predetermined reference voltage by multiplying the positive electrode voltage of the battery pack by a predetermined ratio.

The method may further include: opening the second main relay during the diagnosis period.

The method may further include: opening a precharge relay connected in parallel to the first main relay during the diagnosis period.

Advantageous Effects

The present invention provides a method for diagnosing an external short circuit capable of diagnosing an external short circuit without damaging devices constituting the battery system, and a battery system to which the same is applied.

BRIEF DESCRIPTION OF THE DRAWINGS

FIG. 1 is a diagram illustrating a battery system according to an exemplary embodiment.

FIG. 2 is a diagram illustrating a case in which an external short circuit occurs in a battery system according to an exemplary embodiment.

FIG. 3 is a flowchart illustrating a method for diagnosing an external short circuit according to an exemplary embodiment.

DETAILED DESCRIPTION

Hereinafter, the exemplary embodiments of the present invention will be described with reference to the accompanying drawings, in which like numbers refer to like elements throughout although the exemplary embodiments are different, and a redundant description thereof is omitted. In the following description, usage of suffixes, such as 'module', 'part' or 'unit' used for referring to elements is given merely to facilitate explanation of the present invention, without having any significant meaning by itself. In describing the present invention, if a detailed explanation for a related known function or construction is considered to unnecessarily divert the gist of the present invention, such explanation has been omitted but would be understood by those skilled in the art. The accompanying drawings of the present invention aim to facilitate understanding of the present invention and should not be construed as limited to the accompanying drawings. Also, the present invention is not limited to a specific disclosed form, but includes all modifications, equivalents, and substitutions without departing from the scope and spirit of the present invention.

It will be understood that, although the terms first, second, etc. may be used herein to describe various elements, these elements should not be limited by these terms. These terms are only used to distinguish one element from another.

It is to be understood that when one element is referred to as being "connected to" or "coupled to" another element, it may be connected directly to or coupled directly to another element or be connected to or coupled to another element, having the other element intervening therebetween. Meanwhile, it is to be understood that when one element is referred to as being "connected directly to" or "coupled directly to" another element, it may be connected to or coupled to another element without the other element intervening therebetween.

It will be further understood that the terms "comprise" or "have" used in this specification, specify the presence of stated features, numbers, steps, operations, components, parts, or a combination thereof, but do not preclude the presence or addition of one or more other features, numerals, steps, operations, components, parts, or a combination thereof.

FIG. 1 is a diagram illustrating a battery system according to an exemplary embodiment.

The battery system 1 may include a battery pack 10, a battery management system (BMS) 20, a first main relay 31, a second main relay 32, a precharge relay 33, a precharge resistor 34, a current sensor 50, and a link capacitor 60.

The external power device 2 may be a load receiving power from the battery system 1 or a charger for charging the battery system 1. For example, the external power device 2 may include at least one of an inverter, a DC-DC converter, a motor, an electronic control circuit, an on board charger (OBC), and a fast charger of a vehicle including the battery system 1.

As shown in FIG. 1, the battery pack 10 includes a plurality of battery cells 10_1-10_n connected in series. n may be a natural number of 2 or greater. Although one battery pack 10 is shown in FIG. 1, the battery system 1 may include a plurality of battery packs connected in series, parallel, or series-parallel.

The current sensor 50 may detect a current (hereinafter referred to as battery pack current) flowing through the battery pack 10 and transmit a signal indicating the detected current to the BMS 20.

The link capacitor 60 is connected between the two output terminals P+ and P− of the battery system 1.

The BMS 20 may manage an operation of the battery pack 10. For example, the BMS 20 may be connected to the plurality of battery cells 10_1 to 10_n, measure cell voltages of the plurality of battery cells 10_1 to 10_n, receive information, such as temperature, of the battery pack 10 and a battery pack current, control charging and discharging of the battery pack 10 based on the plurality of cell voltages of the plurality of battery cells 10_1 to 10_n, the battery pack current, the temperature, etc. and control a cell balancing operation for the plurality of battery cells 10_1 to 10_n.

The first main relay 31, the second main relay 32, and the precharge relay 33 form a current path through which a charging current or a discharging current of the battery pack 10 flows. The precharge relay 33 is connected in parallel with the first main relay 31 together with the precharge resistor 34.

One end of the first main relay 31 is connected to a link line 41, and the other end of the first main relay 31 is connected to a link line 43. One end of the second main relay 32 is connected to a link line 42, and the other end of the second main relay 32 is connected to a link line 44. One end of the precharge relay 33 is connected to the link line 43, the other end of the precharge relay 33 is connected to one end of the precharge resistor 34, and the other end of the precharge resistor 34 is connected to the link line 41.

The link line 41 extends between a positive electrode of the battery pack 10 and one end of the first main relay 31, the link line 42 extends between a negative electrode of the battery pack 10 and one end of the second main relay 32, the link line 43 extends between the other end of the first main relay 31 and a first input terminal IN1 of an external power device 2, and the link line 44 extends between the other end of the second main relay 32 and the second input terminal IN2 of the external power device 2.

The BMS 20 may generate relay control signals RCS1 to RCS3 that control opening and closing of the first and second main relays 31 and 32 and the precharge relay 33 and supply the generated relay control signals RCS1 to RCS3 to the first and second main relays 31 and 32 and the precharge relay 33. The first main relay 31 is closed by an ON level of the relay control signal RCS1 and opened by an OFF level of the relay control signal RCS1. The second main relay 32 is closed by an ON level of the relay control signal RCS2 and opened by an OFF level of the relay control signal RCS2. The precharge relay 33 is closed by an ON level of the relay control signal RCS3 and opened by an OFF level of the relay control signal RCS3.

When connecting the battery pack 10 to the external power device 2 for charging and discharging, the BMS 20 controls the second main relay 32 and the precharge relay 33 to be closed, and after the lapse of a predetermined first period, the BMS 20 may control the first main relay 31 to be closed. The BMS 20 may control the precharge relay 33 to be opened after the lapse of a predetermined second period from a point in time when the first main relay 31 is closed. In order to control the above operation, after generating the ON level relay control signals RCS2 and RCS3, the BMS 20 may generate the ON level relay control signal RCS1 after the lapse of the first period, and may generate the OFF level relay control signal RCS3 after the lapse of the second period.

The BMS 20 may close only the first main relay 31 for a predetermined diagnosis period before charging and discharging in order to diagnose an external short circuit of the battery system 1. During the diagnosis period, only the relay control signal RCS1 may be at the ON level, and the relay control signals RCS2 and RCS3 may be at the OFF level.

During the diagnosis period, the BMS 20 may measure a voltage of the link line 44, and when a voltage difference between a voltage of the measured link line 44 (hereinafter, referred to as a "negative link line voltage) VL– and a positive electrode voltage VP+ of the battery pack 10 is less than or equal to a predetermined reference voltage, the BMS 20 may determine that an external short circuit has occurred.

FIG. 2 is a circuit diagram illustrating a battery system during a diagnosis period for an external short circuit according to an exemplary embodiment.

As shown in FIG. 2, an electrical connection indicated by the dotted line may be formed between the link lines 43 and 44 due to an external short circuit. During the diagnosis period, the first main relay 31 is in a closed state.

FIG. 3 is a flowchart illustrating a method for diagnosing an external short circuit according to an exemplary embodiment.

First, the BMS 20 closes the first main relay 31 (S1). That is, the BMS 20 generates the ON level relay control signal RCS1 and supplies the generated ON level relay control signal RCS1 to the first main relay 31. The BMS 20 opens the second main relay 32 and the precharge relay 33 during the diagnosis period to perform an external short circuit.

The BMS 20 measures the positive electrode voltage VP+ and the negative link voltage VL– of the battery pack 10 (S2). The BMS 20 may measure the positive electrode voltage of the battery cell 10_1 as the positive electrode voltage VP+ of the battery pack 10 and measure the voltage of the link line 44 as the negative link voltage VL–.

The BMS 20 calculates a voltage difference VD between the positive electrode voltage VP+ of the battery pack 10 and the negative link voltage VL–(S3). For example, the BMS 20 may calculate a voltage difference by subtracting the negative link voltage VL– from the positive electrode voltage VP+.

The BMS 20 compares the voltage difference VD with a reference voltage VR (S4). For example, the BMS 20 may compare whether the voltage difference VD is smaller than the reference voltage VR, and the BMS 20 may generate the reference voltage VR by multiplying the measured positive electrode voltage VP+ of the battery pack 10 by a predetermined ratio (e.g., 50%) to generate the reference voltage VR. The ratio of 50% is an example, and the present invention is not limited thereto.

When the voltage difference VD is smaller than the reference voltage VR as a result of the comparison in operation S4, the BMS 20 determines that an external short circuit has occurred (S5). When an external short circuit occurs, the positive electrode of the battery pack 10 is electrically connected to the link line 44 through the first main relay 31 and a short circuit 45. Then, the negative link voltage VL– may become a level close to the positive electrode voltage VP+. Accordingly, the voltage difference VD between the positive electrode voltage VP+ and the negative link voltage VL– is a very small voltage due to the external short circuit. The reference voltage VR may be set to a level for detecting the voltage difference VD when an external short circuit occurs.

When the voltage difference is equal to or greater than the reference voltage as the result of the comparison in operation S4, the BMS 20 determines a normal state in which an external short circuit has not occurred and terminates the diagnosis (S6). In the normal state, the negative link voltage VL– may be 0V.

The exemplary embodiments of the present invention have been described in detail, but the scope of the present invention is not limited thereto and various variants and modifications by a person skilled in the art using a basic concept of the present invention defined in claims also belong to the scope of the present invention.

The invention claimed is:

1. A battery system comprising:
a battery pack including a plurality of battery cells;
a first main relay including a first end connected to a positive electrode of the battery pack;
a second main relay including a first end connected to a negative electrode of the battery pack;
a first link line connected to a second end of the first main relay;
a second link line connected to a second end of the second main relay; and
a battery management system configured to
close the first main relay,
measure a positive electrode voltage of the battery pack and a negative link voltage of the second link line while the first main relay is closed and the second main relay is open, and
determine an occurrence of an external short circuit in response to a voltage difference between the positive electrode voltage of the battery pack and the negative link voltage being less than a predetermined reference voltage.

2. The battery system of claim 1, wherein:
the battery management system is configured to determine the occurrence of the external short circuit in response to a voltage obtained by subtracting the negative link voltage from the positive electrode voltage of the battery pack being less than the predetermined reference voltage.

3. The battery system of claim 2, wherein:
the battery management system is configured to:
generate the predetermined reference voltage by multiplying the positive electrode voltage of the battery pack by a predetermined ratio.

4. The battery system of claim 1, wherein:
the battery management system is configured to:
close the first main relay and opens the second main relay during a predetermined diagnosis period for determining the occurrence of the external short circuit.

5. The battery system of claim 1, further comprising:
a precharge relay connected in parallel to the first main relay,
wherein the battery management system is configured to:
close the first main relay and opens the precharge relay during a predetermined diagnosis period for determining the occurrence of the external short circuit.

6. A method for diagnosing an external short circuit of a battery system including a first main relay including a first end connected to a positive electrode of a battery pack including a plurality of battery cells, a second main relay including a first end connected to a negative electrode of the battery pack, and a battery management system, the method comprising:
closing the first main relay during a diagnosis period;
measuring a positive electrode voltage of the battery pack and a negative link voltage of a second link line, while the first main relay is closed and the second main relay is open;

comparing a voltage difference between the positive electrode voltage of the battery pack and the negative link voltage with a predetermined reference voltage; and determining an occurrence of an external short circuit in response to the voltage difference being less than the predetermined reference voltage.

7. The method of claim 6, wherein:

the comparing of the voltage difference with the predetermined reference voltage includes determining whether a voltage obtained by subtracting the negative link voltage from the positive electrode voltage of the battery pack is smaller than the predetermined reference voltage.

8. The method of claim 7, further comprising:

generating the predetermined reference voltage by multiplying the positive electrode voltage of the battery pack by a predetermined ratio.

9. The method of claim 6, further comprising:

opening the second main relay during a diagnosis period.

10. The method of claim 6, further comprising:

opening a precharge relay connected in parallel to the first main relay during the diagnosis period.

11. A battery system comprising:

a battery pack including a plurality of battery cells;

a first main relay including a first end connected to a positive electrode of the battery pack;

a second main relay including a first end connected to a negative electrode of the battery pack;

a first link line connected to a second end of the first main relay;

a second link line connected to a second end of the second main relay and an external connection line; and a battery management system configured to close the first main relay;

measure a positive electrode voltage of the battery pack and a negative link voltage of the second link line at the external connection line while the first main relay is closed and the second main relay is open; and determine an occurrence of an external short circuit in response to a voltage difference between the positive electrode voltage of the battery pack and the negative link voltage being less than a predetermined reference voltage before closing the second main relay to allow current to an external device connected to the external connection line.

\* \* \* \* \*